US006529607B1

(12) United States Patent

Sigwanz et al.

(10) Patent No.: US 6,529,607 B1
(45) Date of Patent: Mar. 4, 2003

(54) METHOD FOR PRODUCING A CONSTANT SOUND PRESSURE LEVEL IN HEARING AIDS AND CORRESPONDING HEARING AID

(75) Inventors: Ullrich Sigwanz, Erlangen (DE); Frank Wagner, Nürnberg (DE)

(73) Assignee: Siemens Audiologische Technik GmbH, Erlangen (DE)

(*) Notice: Subject to any disclaimer, the term of this patent is extended or adjusted under 35 U.S.C. 154(b) by 0 days.

(21) Appl. No.: 09/856,692

(22) PCT Filed: Dec. 1, 1999

(86) PCT No.: PCT/EP99/09400

§ 371 (c)(1),
(2), (4) Date: Nov. 28, 2001

(87) PCT Pub. No.: WO00/36876

PCT Pub. Date: Jun. 22, 2000

(30) Foreign Application Priority Data

Dec. 11, 1998 (DE) ........................................ 198 57 347

(51) Int. Cl.[7] ........................... H03G 3/00; H03G 7/00; H04R 25/00

(52) U.S. Cl. ....................... 381/107; 381/106; 381/312; 381/321

(58) Field of Search ................................ 381/107, 106, 381/312, 321

(56) References Cited

U.S. PATENT DOCUMENTS

| | | | | |
|---|---|---|---|---|
| 4,792,977 A | | 12/1988 | Anderson et al. | 381/64.4 |
| 4,934,770 A | | 6/1990 | Anderson et al. | 330/278 |
| 5,276,739 A | | 1/1994 | Krokstad et al. | 381/68.2 |
| 5,687,241 A | * | 11/1997 | Ludvigsen | 381/312 |
| 5,724,433 A | | 3/1998 | Engebretson et al. | 381/106 |
| 5,923,767 A | * | 7/1999 | Frindle et al. | 381/102 |
| 6,298,139 B1 | * | 10/2001 | Poulsen et al. | 381/102 |

FOREIGN PATENT DOCUMENTS

| | | |
|---|---|---|
| DE | 19 27 848 | 12/1970 |
| DE | 32 20 758 | 12/1983 |
| DE | 195 46 596 | 6/1997 |
| DE | 196 24 092 | 11/1997 |
| EP | 0 077 688 A1 | 4/1983 |
| EP | 0 250 679 B1 | 7/1993 |
| WO | WO 97/11572 | 3/1997 |
| WO | WO 97/28600 | 8/1997 |

* cited by examiner

*Primary Examiner*—Forester W. Isen
*Assistant Examiner*—Elizabeth McChesney
(74) *Attorney, Agent, or Firm*—Schiff Hardin & Waite

(57) ABSTRACT

In a method and apparatus for producing constant sound pressure level in a hearing aid, a microphone, a receiver and a signal processing unit are provided. A switching unit produces constant sound pressure levels. The switching unit has an envelope generator for producing an envelope value of a signal value to be processed and a divider for calculating the ratio of the signal value and the envelope value as the signal to be output or further processed.

14 Claims, 1 Drawing Sheet

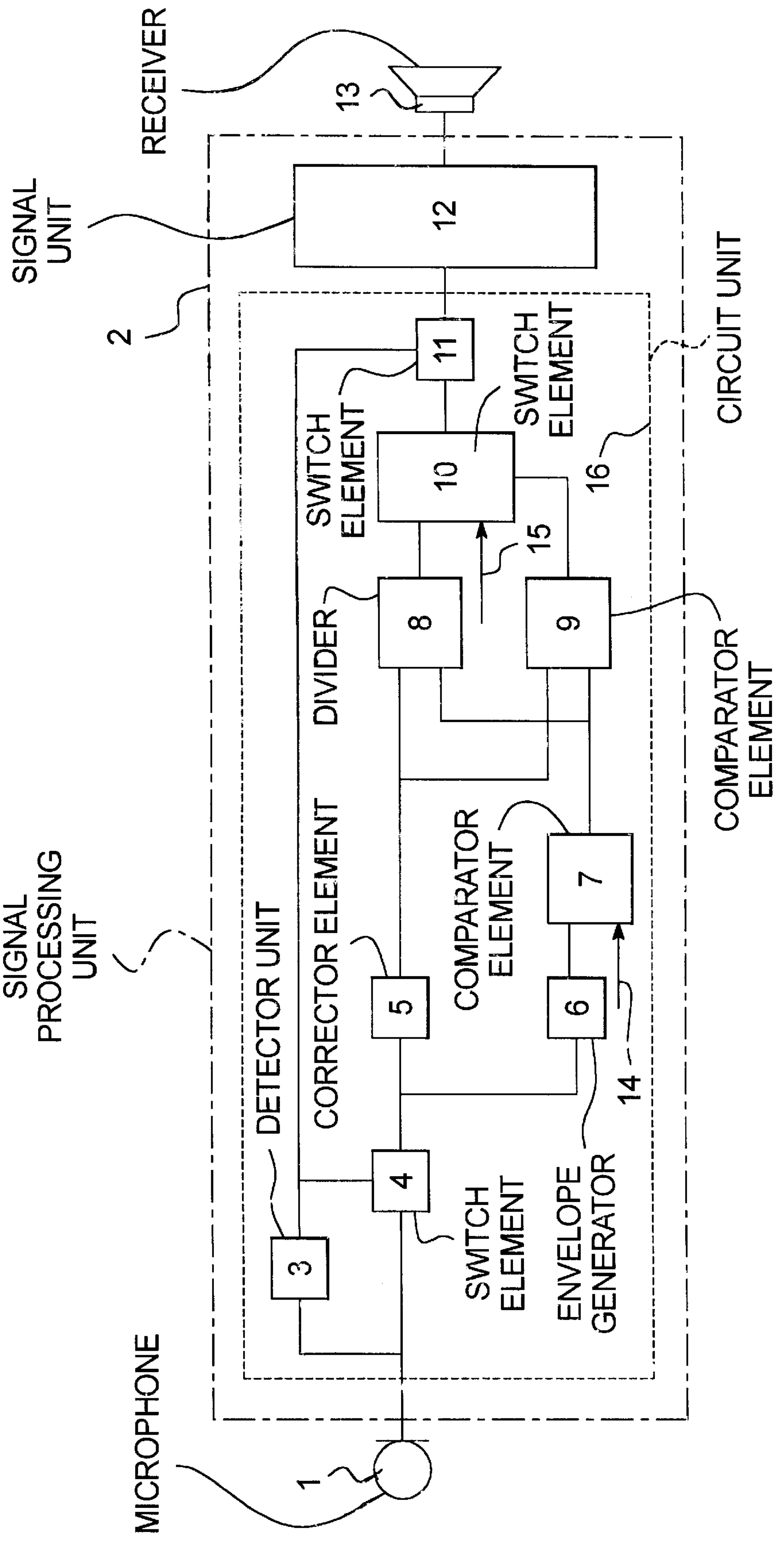
RECEIVER
13
SIGNAL UNIT
12
2
CIRCUIT UNIT
11
SWITCH ELEMENT
SWITCH ELEMENT
10
16
15
DIVIDER
8
9
COMPARATOR ELEMENT
COMPARATOR ELEMENT
7
SIGNAL PROCESSING UNIT
DETECTOR UNIT
CORRECTOR ELEMENT
5
6
14
4
3
SWITCH ELEMENT
ENVELOPE GENERATOR
MICROPHONE
1

METHOD FOR PRODUCING A CONSTANT SOUND PRESSURE LEVEL IN HEARING AIDS AND CORRESPONDING HEARING AID

BACKGROUND OF THE INVENTION

The invention relates to a hearing aid having a microphone, a receiver, and a signal processing unit with a circuit unit for producing constant sound pressure levels. The circuit unit has an envelope generator for producing an envelope value of a signal value to be processed and a divider for calculating a ratio of the signal value and the calculated envelope value of the signal value to be processed. The invention also relates to a method for operating a hearing aid wherein a microphone, a receiver, and a signal processing unit with a circuit unit for producing constant sound pressure levels are provided.

A common problem with hearing aids is to avoid exceeding an adjustable discomfort threshold in the signal amplification, and hence to produce constant sound pressure levels. This can be achieved by signal amplitude regulation with a feedback structure, the (amplified) input signal being fed to a level detector and the output value of the latter being delivered to a control loop with attenuation of the output signal at increasing input signal strength.

In the event of high amplification within the control loop, phase shifts of approximately 180° occur so that undesired co-coupling takes place instead of the required anti-coupling.

WO 97/28600 discloses a "compander", i.e. compressor/expander circuit, for use in a battery-driven instrument. The instrument comprises an input for picking up an analog input signal, a signal processing unit for producing a digital signal, which corresponds to the envelope curve of the input signal, and a combining unit for combining the digitized envelope curve with the analog input signal, in order to provide an analog output signal. When compressing the analog input signal, the output signal is proportional to the product of the input signal and the reciprocal of the envelope curve. When expanding the analog input signal, the output signal is proportional to the product of the input signal and the envelope curve.

U.S. Pat. No. 5,724,433 discloses a circuit for automatic gain control in a hearing aid. The circuit comprises an adaptive compression and filter circuit having a plurality of channels which are connected to a common output. The gain of a channel is dependent on the output signal and a discomfort threshold for the channel in question. The gain adjustment of the channel in question is increased whenever the output signal of the channel is below a pre-adjustable threshold, and is reduced whenever the output signal is above the threshold.

In another embodiment, a forward structure with a gain table is used to produce constant sound pressure levels in hearing aids according to the prior art. This has, inter alia, the disadvantage that the gain table grows super-proportionately with the stored gains at higher amplification. Further, discontinuities may occur in the transition range between two stored gains, which can lead to an increased perturbation factor of the signal.

SUMMARY OF THE INVENTION

It is an object of the invention to provide a hearing aid, as well as a method for operating a hearing aid, in which the sound pressure level at the output does not exceed an adjustable discomfort threshold.

The object is achieved, in relation to the hearing aid, wherein a microphone, a receiver and a signal processing unit with a circuit unit for producing constant sound pressure levels are provided. The circuit unit has an envelope generator for producing an envelope value of a signal value to be processed and a divider for calculating a ratio of the signal value and the calculated envelope value of the signal value to be processed. A comparator element is provided for comparing the envelope value from the envelope generator with a gain parameter. Further processing of the signal to be processed takes place based on the gain parameter when the envelope value falls below the gain parameter, and based on the envelope value when the envelope value reaches or exceeds the gain parameter. In relation to the method, the object is achieved by providing a microphone, a receiver and a signal processing unit with a circuit unit for producing constant sound pressure levels. The envelope value is compared with a gain parameter and the signal to be processed is processed further based on the envelope value if the gain parameter is reached or exceeded. Otherwise the signal to be processed is processed further based on the gain parameter.

A concept of the invention is that signal values of a signal, whose envelope values exceed an adjustable threshold value, are divided by the envelope values. This gives rise to a signal having a constant envelope. If this signal is output to the receiver of the hearing aid, then the resulting signal has a constant sound pressure level.

The invention is distinguished in that, in the case of a hearing aid, the sound pressure level at the output does not exceed an adjustable threshold value, and is kept constant over a large variation range of the sound pressure level at the input and/or a large amplification range. This is achieved at low cost and with at most minor signal distortions.

In the hearing aid according to the invention, the envelope of the signal which is to be processed, and whose sound pressure level is to be limited, is calculated in an envelope generator. Ratios of the signal values of the signal to be processed and the associated envelope values are calculated in a divider. The signal values at the output of the divider therefore lie in a restricted value range, for example in the range between −1 and +1. Owing to the limited rise time of envelope generators that can be made, it is possible in practice for signal values to lie briefly outside the range enclosed by the envelope. According to one embodiment of the invention, such signal values are detected and likewise transposed into the restricted value range. For example, a constant value is allocated to each signal value outside the range enclosed by the envelope. The output signal comprised of the individual output signal values has a substantially constant envelope curve over a specific amplification range of the hearing aid.

The hearing aid according to the invention has, in particular, digital signal processing with a DSP element. In this case, the circuit complexity of the hearing aid according to the invention can be reduced in an advantageous embodiment, through detection of the sign of the signal and envelope values to be processed, and by processing only positive values and inverting negative values. By means of this, a 1-quadrant divider, which comprises a simply constructed shift-subtract unit, can be used as the divider.

In order to reduce the risk of clipping, the signal value of the signal to be processed is reduced by an adjustable corrector element before taking the ratio.

The calculated envelope value is advantageously compared, in a comparator element, with a gain parameter. The latter may correspond to the reciprocal of the maximum possible gain in the hearing aid. Then, if the envelope value falls below the adjustable gain parameter, this means that the signal to be processed lies below the adjusted discomfort threshold; and the gain parameter, instead of the envelope value, is used for the further processing, so that oversensitivity of the signal processing of the hearing aid is prevented.

In an advantageous embodiment, the signal value and the calculated envelope value are compared with one another in a comparator element, in order to prevent the value of the ratio of the signal value and the envelope value from exceeding the representable number range of from "−1" to "+1".

If the ratio of the signal and envelope values exceeds the value "1" in magnitude, an output fixed value is determined by a switch element as the signal to be output, instead of the calculated ratio, so as to comply with the specified number range of from "−1" to "+1".

In the method according to the invention, constant sound pressure levels are produced by taking the ratio of the signal value and the envelope value of the signal value. The output signal comprised of the individual ratio values is limited with respect to its sound pressure level, and it has a substantially constant envelope curve.

In a method variation according to the invention, the signal value to be output or further processed corresponds to the value of the ratio or the signal value and the envelope value if the envelope value exceeds the signal value. The representable number range of from "−1" to "+1" can hence be complied with in digital signal processing.

If the ratio of the signal value and the envelope value then leaves the representable number range, i.e. its magnitude exceeds the value "1", then not the ratio but rather a predeterminable output fixed value within the representable number range is used as the signal value to be output.

Other method variations have already been described in connection with the hearing aid according to the invention, or will be presented with the aid of the exemplary embodiment.

BRIEF DESCRIPTION OF THE DRAWINGS

The drawing FIGURE shows in block diagram format the hearing aid according to the invention.

DESCRIPTION OF THE PREFERRED EMBODIMENT

For the purposes of promoting an understanding of the principles of the invention, reference will now be made to two preferred embodiments illustrated in the drawings and specific language will be used to describe the same. It will nevertheless be understood that no limitation of the scope of the invention is thereby intended, such alterations and further modifications in the illustrated devices and methods, and such further applications of the principles of the invention as illustrated therein being contemplated as would normally occur to one skilled in the art to which the invention relates.

The drawing FIGURE shows a block diagram of the hearing aid according to the invention. In general, the term "hearing aid" is to be understood as meaning both a separate ITE or BTE instrument and an implantable hearing aid, i.e. generally an instrument to assist hearing.

The block diagram depicts the key elements of the hearing aid according to the invention; other elements such as e.g. A/D and D/A convertors are not depicted.

The hearing aid has a microphone 1, a signal processing unit 2 and a receiver 13. The signal to be processed passes, starting from the microphone 1, through a circuit unit 16 which, beyond a specific input sound pressure level, delivers an output signal with a constant envelope. The level-limited output signal from the circuit unit 16 is then, in the signal unit 12 which is e.g. designed as a DSP element, further processed and sent to the receiver 13.

The value range of the signal to be processed lies between −1 and +1 in the exemplary embodiment. Upon entry into the circuit unit 16, the sign of a signal value to be processed is established by the detector element 3. If it is negative, sign inversion takes place in the switch element 4, otherwise the signal value to be processed passes through the switch element 4 without inversion.

In the corrector element 5, the value of the signal to be processed can be multiplied by an adjustable factor in order to prevent clipping. The factor ½ reduces, for example, the sound pressure level of the signal by 6 dB. Further, this factor can also be used to adjust the discomfort threshold. In the hearing aid according to the invention, an envelope value is first calculated in an envelope generator 6 for a signal value of the signal to be processed. This envelope value is compared with an adjustable gain parameter 14 in the comparator element 7. The envelope value is forwarded as the output signal of the comparator element if it reaches or exceeds the gain parameter 14.

When falling below the gain parameter 14, the fact that the envelope value lies below the adjusted discomfort threshold is detected and, instead of the envelope value, the gain parameter 14 that e.g. corresponds to the reciprocal of the maximum possible gain of the hearing aid is forwarded as the output signal of the comparator element 7.

The signal value and the output value of the comparator element 7 are compared in the comparator element 9, while the ratio of the signal value and the output value of the comparator element 7 is calculated in the divider 8, which is advantageously designed as a 1-quadrant divider.

When, as a result of the value comparison in the comparator element 9, it is established that the output value of the comparator element 7 exceeds the signal value, the ratio that results from dividing the signal value and output value of the comparator element 7 in the divider 8 is forwarded by the switch element 10 as its output signal.

If, however, the signal value exceeds the output value of the comparator element 7, and this is established by the comparator element 9, an adjustable output fixed value 15 is forwarded in the switch element 10 as its output signal, instead of the ratio of the signal value and the output value of the comparator element 7.

The output fixed value 15 does not exceed the representable number range of e.g. from "−1" to "+1", and can therefore be further processed in the signal unit 12.

In general, the switch element 10 has a relay function and is used as a 1 from 2 multiplexer.

If the signal value of the negative half-wave of a signal is processed in the circuit unit 16, the positive sign of the signal to be output can be inverted into a negative signal by the switch element 11 after the switch element 10 following detection by the detector element 3. Otherwise, the output signal of the switch element 10 passes through the switch element 11, without sign correction, for further processing in the signal unit 12.

According to the invention, a level-limited output signal is available, after the described signal processing in the circuit unit 16, for further processing in the signal unit 12.

The signal to be processed in the exemplary embodiment is the digital acoustic output signal of a microphone. The value range of this signal lies between −1 and +1. The invention is not in that regard restricted to this value range. Following appropriate adaptation of the circuit, signals with any value range can be processed according to the same principle. The signal may also pass through a signal pre-processing unit (not shown) before the circuit unit for producing constant sound pressure levels. Such a preprocessing unit may, for example, comprise filtering or amplification.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A hearing aid, comprising:

a microphone;

a receiver and a signal processing unit connected to said receiver with a circuit unit for producing constant sound pressure levels;

the circuit unit having an envelope generator for producing an envelope value of a signal value to be processed and a divider for calculating a ratio of the signal value and the produced envelope value of the signal value to be processed;

a comparator element for comparing the envelope value from the envelope generator with a gain parameter; and further processing the signal value to be processed based on the gain parameter when the envelope value falls below the gain parameter, and further processing the signal value to be processed based on the envelope value when the envelope value reaches or exceeds the gain parameter.

2. The hearing aid of claim 1, wherein the divider is a 1-quadrant divider.

3. The hearing aid of claim 1, wherein a corrector element is provided for reducing the signal value of the signal to be processed in order to prevent clipping.

4. The hearing aid of claim 1, wherein the gain parameter is adjustable.

5. The hearing aid of claim 1, wherein a comparator element is provided for comparing the signal value with the calculated envelope value.

6. The hearing aid of claim 1, wherein a switch element is provided for switching an output fixed value or the output value of the divider as the signal to be output by the switching unit.

7. A method for operating a hearing aid, comprising the steps of:

providing a microphone, a receiver, and a signal processing unit with a circuit unit for producing constant sound pressure levels;

providing an envelope generator in the circuit unit and producing an envelope value of a signal value to be processed;

providing a divider in the circuit unit and calculating a ratio of the signal value and the produced envelope value of the signal value to be processed;

comparing the envelope value from the envelope generator with a gain parameter; and further processing the signal to be processed based on the gain parameter when the envelope value falls below the gain parameter, and further processing the signal to be processed based on the envelope value when the envelope value reaches or exceeds the gain parameter.

8. The method of claim 7, wherein the ratio of the signal value and the envelope value of the signal value is calculated as the signal value to be output or further processed.

9. The method of claim 7, wherein the signal value is reduced before taking the ratio with the envelope value in order to prevent a risk of clipping.

10. The method of claim 7, wherein a negative sign of the signal value is detected and inverted.

11. The method of claim 7, wherein the signal value to be output corresponds to the value of the ratio of the signal value and the envelope value if the envelope value exceeds the signal value.

12. The method of claim 7, wherein the signal value to be output corresponds to a predeterminable output fixed value if the envelope value corresponds to the signal value or falls below the signal value.

13. A hearing aid, comprising:

a microphone;

a receiver and a signal processing unit connected to said receiver with a circuit unit for producing regulated sound pressure levels;

the circuit unit having an envelope generator for producing an envelope value of a signal value to be processed and a divider for calculating a ratio of the signal value and the produced envelope value of the signal value;

a comparator element for comparing the envelope value with a gain parameter; and further processing the signal value based on the gain parameter when the envelope value falls below the gain parameter and based on the envelope value when the envelope value exceeds the gain parameter.

14. A method for operating a hearing aid, comprising the steps of:

providing a microphone, a receiver, and a signal processing unit with a circuit unit for producing regulated sound pressure levels;

providing an envelope generator in the circuit unit and producing an envelope value of a signal value to be processed;

providing a divider in the circuit unit and calculating a ratio of the signal value and the produced envelope value of the signal value;

comparing the envelope value from the envelope generator with a gain parameter; and further processing the signal value based on the gain parameter when the envelope value falls below the gain parameter and based on the envelope value when the envelope value exceeds the gain parameter.

* * * * *